US009778310B2

(12) United States Patent
Schliebe

(10) Patent No.: US 9,778,310 B2
(45) Date of Patent: Oct. 3, 2017

(54) APPARATUS AND METHOD FOR DETECTION OF SOLENOID CURRENT

(75) Inventor: Paul Schliebe, Dexter, MI (US)

(73) Assignee: Kelsey-Hayes Company, Livonia, MI (US)

(*) Notice: Subject to any disclaimer, the term of this patent is extended or adjusted under 35 U.S.C. 154(b) by 871 days.

(21) Appl. No.: 12/940,306

(22) Filed: Nov. 5, 2010

(65) Prior Publication Data

US 2012/0112771 A1    May 10, 2012

(51) Int. Cl.
G01R 31/06 (2006.01)
G01R 27/26 (2006.01)
G01R 31/02 (2006.01)

(52) U.S. Cl.
CPC .......... *G01R 31/06* (2013.01); *G01R 31/025* (2013.01)

(58) Field of Classification Search
CPC ..................................................... G01R 27/26
USPC .................................................. 324/546, 659
See application file for complete search history.

(56) References Cited

U.S. PATENT DOCUMENTS

| 4,168,866 | A  | * | 9/1979  | McNinch et al. ............ 303/149 |
| 4,477,768 | A  |   | 10/1984 | Hiramoto et al. |
| 5,111,137 | A  |   | 5/1992  | Heumann et al. |
| 5,172,293 | A  |   | 12/1992 | Matsumoto et al. |
| 6,909,285 | B2 | * | 6/2005  | Jordan et al. ................. 324/382 |
| 7,126,368 | B2 | * | 10/2006 | Paulson et al. .......... 324/765.01 |
| 7,154,278 | B2 |   | 12/2006 | Scholl et al. |
| 7,363,127 | B2 | * | 4/2008  | Fogelstrom .................. 701/33.4 |
| 7,443,309 | B2 | * | 10/2008 | Baldwin ............... H01H 83/04  340/514 |
| 7,564,274 | B2 | * | 7/2009  | Hughes ........................ 327/108 |
| 7,576,959 | B2 | * | 8/2009  | Huang et al. ................... 361/42 |
| 7,679,370 | B2 | * | 3/2010  | Nair .............................. 324/509 |
| 2007/0025030 | A1 |  | 2/2007  | Jung |
| 2010/0002473 | A1 | * | 1/2010 | Williams .................. 363/21.06 |

* cited by examiner

*Primary Examiner* — Jermele M Hollington
*Assistant Examiner* — Feba Pothen
(74) *Attorney, Agent, or Firm* — MacMillan, Sobanski & Todd, LLC

(57) ABSTRACT

An apparatus for detecting leakage current through a solenoid coil that includes a capacitor connected to one end of the solenoid coil and a feedback circuit that monitors the rate of decay of the capacitor voltage to determine if an excessive leakage current is present.

14 Claims, 4 Drawing Sheets

APPARATUS AND METHOD FOR DETECTION OF SOLENOID CURRENT

BACKGROUND OF THE INVENTION

This invention relates in general to systems that include solenoids and in particular to an apparatus and method for detection of small undesired solenoid currents.

A typical prior art control circuit 10 used for multiple solenoids is shown in FIG. 1. The circuit 10 has a common high side Field Effect Transistor (FET) 12 with a drain terminal connected to a power supply V+. The source terminal of the high side FET 12 is connected to a high end of each of a plurality of solenoid coils labeled $L_1$ through $L_N$. The low end of each of the solenoid coils is connected to the drain of an associated low side FET, which is correspondingly labeled $T_1$ through $T_N$. The source of each of the low side FETs is connected to ground. The control circuit 10 also includes a plurality of resistors that are labeled $R_1$ through $R_N$, whose resistance is significantly higher than that of the solenoid coils. Each of the resistors $R_1$ through $R_N$ is connected in parallel with a corresponding coil $L_1$ through $L_N$, respectively to permit detection of an open coil. The gates of the high side FET 12 and the low side FETs $T_1$ through $T_N$ are connected to a controller 14 through an appropriate circuit (not shown) to adapt the controller output voltage level to the voltage level required to switch the FETs. The controller typically includes a microprocessor and an algorithm. The microprocessor is responsive to the algorithm to generate signals to selectively switch the individual FETs between their conducting and non-conducting states. Switching the high side FET 12 to its conducting state provides power to all of the low side FETs $T_1$ through $T_N$, such that switching the low side of a selected FET to a conducting state enables current to flow through the associated solenoid coil.

The circuit 10 further includes a plurality of voltage feedback circuits which are used to detect undesired activations of a solenoid or failures of a solenoid to activate when desired. One high side voltage feedback circuit is shown to the left of FIG. 1 as a voltage divider circuit $VD_F$ that monitors the voltage provided to the high sides of the solenoid coils $L_1$ through $L_N$. The resistance of the voltage divider circuit $VD_F$ is significantly higher than that of the solenoid coils. The feedback voltage is labeled $V_{FBY}$ and is provided to the controller 14. When the high side FET 12 is in a conducting state, a high feedback voltage $V_{FBY}$ will appear at the midpoint of the voltage divider $VD_F$. When the high side FET 12 is in a non-conducting conducting state, a low feedback voltage $V_{FBY}$ will appear at the midpoint of the voltage divider $VD_F$. While a voltage divider circuit $VD_F$ is shown in FIG. 1, the configuration is meant to be illustrative and any other conventional method for monitoring voltage may be utilized.

Also shown in FIG. 1 are a plurality of coil voltage divider circuits, $VD_1$ through $VD_N$, connected between the low end of each solenoid coil and ground. The coil voltage divider circuits $VD_1$ through $VD_N$ monitor individual coil feedback voltages that are labeled $V_{FB1}$ through $V_{FBN}$ with the individual coil feedback voltages being provided to the controller 14. When the high side FET 12 is in its conducting state and a selected low side FET $T_N$ is in its non-conducting state, a high feedback voltage $V_{FBN}$ will appear at the midpoint of the associated voltage divider $VD_N$. When the high side FET 12 and a selected low side FET $T_N$ are in their conducting states, a low feedback voltage $V_{FBN}$ will appear at the midpoint of the associated voltage divider $VD_N$. If the high side FET 12 and a selected low side FET $T_N$ are in their non-conducting states, a low feedback voltage $V_{FBN}$ will appear at the midpoint of the voltage divider $VD_N$. Again, the use of voltage divider circuits $VD_1$ through $VD_N$ for monitoring the coil feedback voltages is meant to be illustrative, and other conventional methods for monitoring the coil feedback voltages also may be utilized.

As described above, when both the high side FET 12 and a selected low side FET, such as $T_2$, are switched to their conducting states, a large current flows through the associated solenoid coil $L_2$ and an associated low feedback voltage $V_{FB2}$ will be provided to the controller 14. When the low side FET $T_2$ is switched to its non-conducting state, a small current will flow through $L_2$ and $VD_2$, and an associated high feedback voltage $V_{FB2}$ will be provided to the controller 14. In the absence of a fault, the level of the voltage feedback $V_{FBY}$ and $V_{FB2}$ would indicate that the FETs 12 and $T_2$ and the coil $L_2$ are operating correctly. A fault due to an open or shorted coil $L_2$ or an open, leaky or shorted low side FET $T_2$ can be detected through the voltage feedback $V_{FB2}$ when the monitored voltages are not as expected, as shown in following table.

| $V_{FBY}$ FEEDBACK VOLTAGE | LOW SIDE FET $T_Y$ COMMANDED STATE | |
|---|---|---|
| | ON | OFF |
| HIGH | OPEN FET | GOOD |
| MID | SHORTED COIL | OPEN COIL or LEAKY FET |
| LOW | GOOD | SHORTED FET |

The resistors $R_1$ through $R_N$, that are connected in parallel with the coils $L_1$ through $L_N$, and the coil voltage divider circuits, $VD_D$ through $VD_N$, allow an open coil to be distinguished from a shorted low side FET. With an open coil, the current flows through the corresponding resistor and the resulting voltage drop causes the voltage feedback to be lower than expected when the FET is off, but not so low as it would be if the low side FET is shorted. Although this allows an open coil to be detected, it may be difficult to distinguish an open coil from a leaky FET in certain ranges of current. If the leakage current is very low, there is little voltage drop across the coil and the resulting feedback voltage is close to the supply voltage and thus may not be detected. If the leakage current is higher, but still relatively low, the feedback voltage is close to the open coil voltage and becomes difficult to distinguish from an open coil.

In certain solenoid control systems, such as, for example, Anti-Lock Brake Systems (ABS) and Electronic Stability Control (ESC) systems used in vehicle electronically controlled brake systems, the solenoids are utilized to operate valves that control the flow of brake fluid during a brake system operation. An unintended leakage current through a solenoid coil could result in a partial or complete opening or a closure of a valve, which could result in an undesired flow or an undesired blockage of brake fluid. If this condition does occur, it is necessary to switch off the high side FET 12 in order to stop the leakage current flow and prevent undesirable effects on brake system performance. Since the high side FET is common to all solenoid coils, switching it off also disables all of the solenoid coils, and therefore all electronically controlled brake system functions which require solenoid operation. In the case of an open solenoid coil, there is no undesired current flowing, so it is not necessary to switch off the high side FET. The other solenoid coils which are functioning properly are not disabled and therefore the only electronically controlled brake system functions which need to be disabled are those that require proper operation of the affected solenoid coil. Accordingly, it would be desirable to provide an apparatus and method to detect such small currents to distinguish a leakage current from an open solenoid coil.

SUMMARY OF THE INVENTION

This invention relates to an apparatus and method for detection of small solenoid currents.

The present invention contemplates an apparatus for controlling current flow through a coil that includes at least one coil having a first end and a second end and a first electronic switch having an input terminal adapted to be connected to a voltage supply and an output terminal connected to the first end of the coil. A second electronic switch is connected between the second end of the coil and ground and a capacitor is connected between the first end of the coil and ground. The capacitor is charged when the first electronic switch is in a conducting state and discharged when the first electronic switch is in a non-conducting state. A feedback circuit is connected to one end of the coil and is operable to provide a discharge path for the capacitor, and to monitor the rate of decay of the resulting capacitor charge to determine if there is a fault present in the control circuit.

The present invention further contemplates a method for detecting leakage current flow through a coil that includes the steps of providing the apparatus described above. The method then places the first electronic switch in a conducting state to charge the capacitor in the feedback circuit. The method next places both the first and second electronic switches in a non-conducting state while monitoring the rate of decay of the charge on the capacitor to determine whether an excessive leakage current is flowing though the coil.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
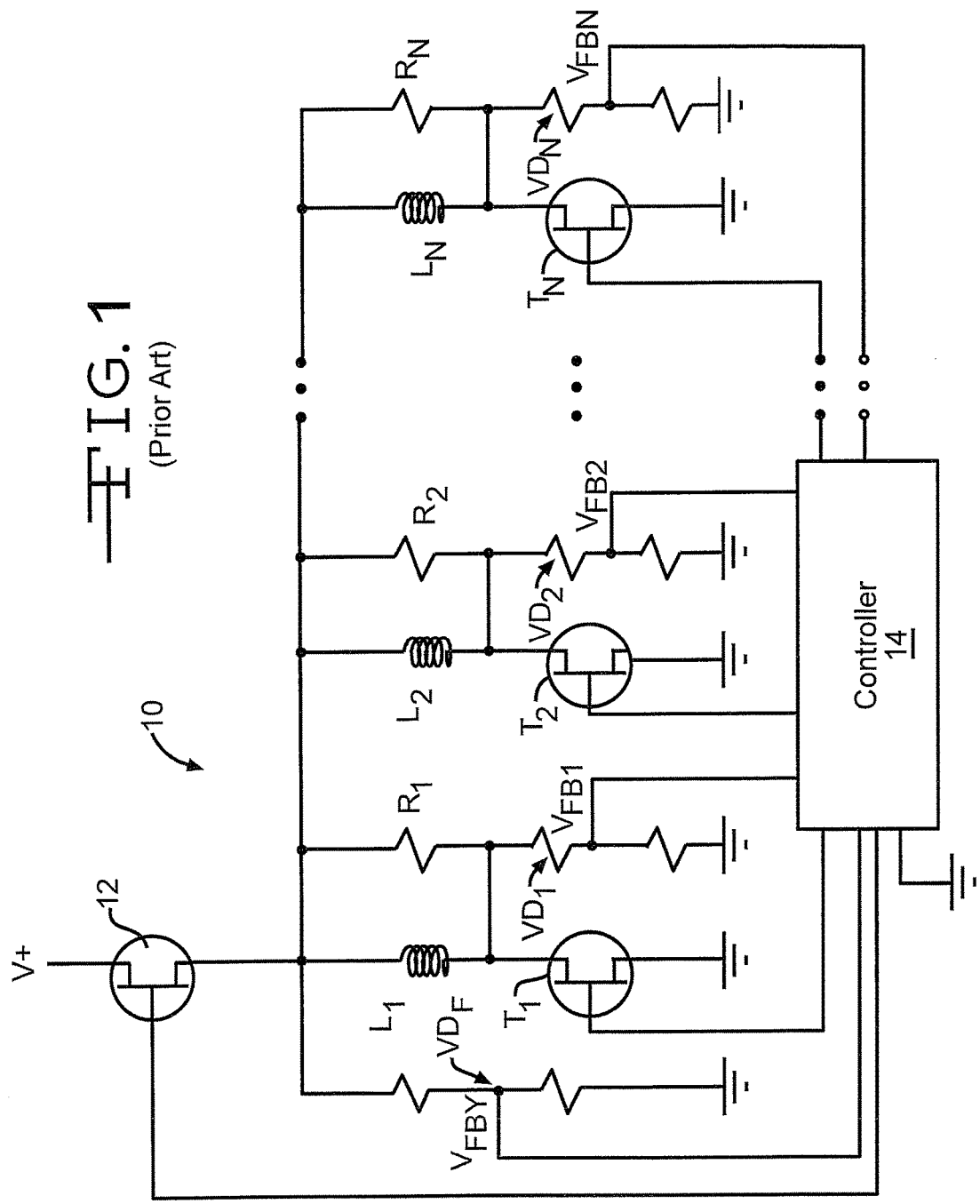
FIG. 1 is a circuit diagram of a prior art control circuit for controlling a plurality of solenoids.
Figure 2:
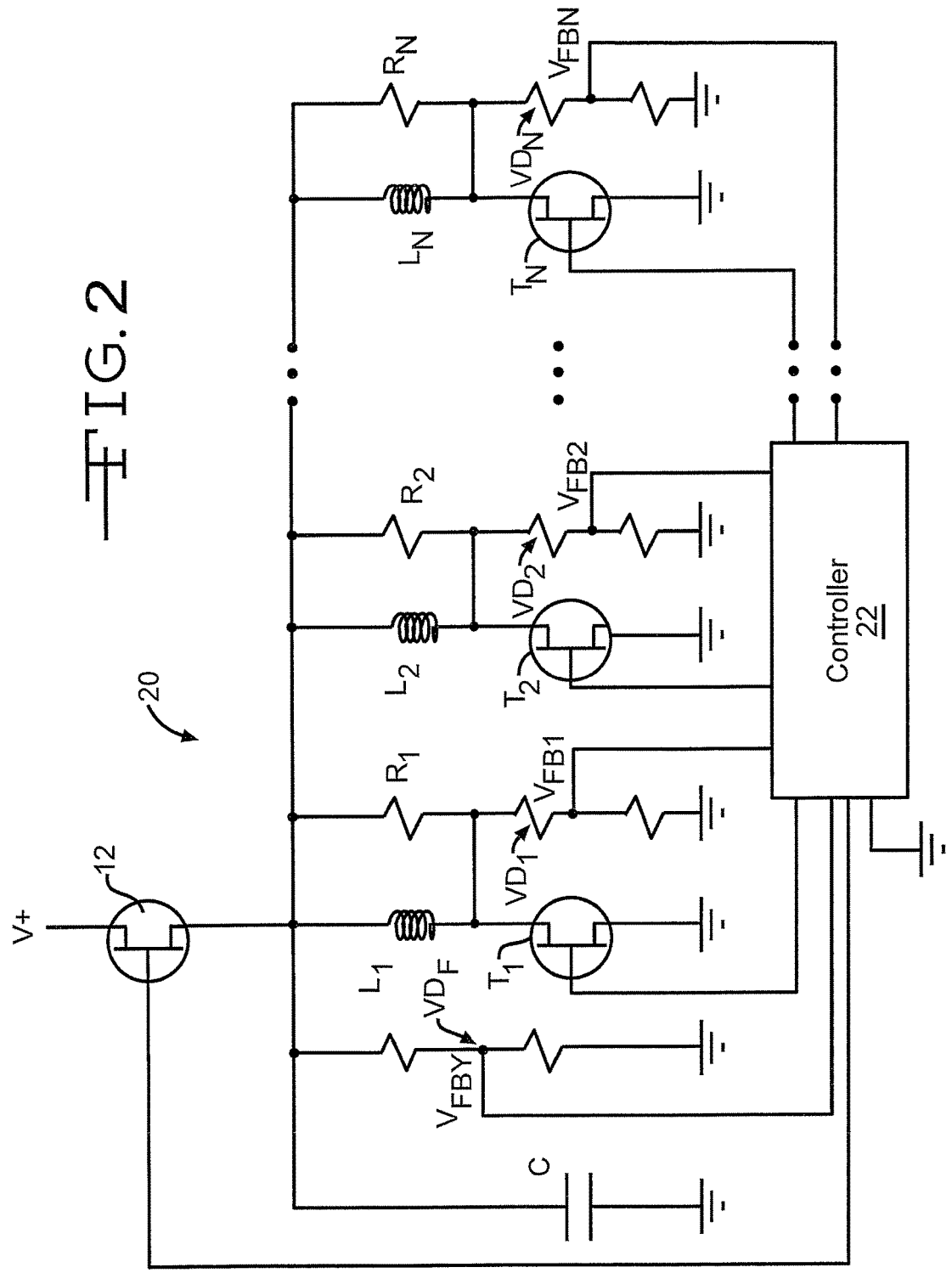
FIG. 2 is a circuit diagram of a control circuit for controlling a plurality of solenoids and that includes a capability for measuring small solenoid currents that is accordance with the present invention.

The present invention is directed toward a low cost circuit that allows detection of low levels of leakage current, not detectable through existing means. Referring now to the drawings, there is illustrated in FIG. 2 a control circuit 20 for controlling a plurality of solenoids that includes a capability for detecting solenoid currents that is in accordance with the present invention. Components appearing in FIG. 2 that are similar to components shown in FIG. 1 have the same numerical identifiers. The present invention provides a means to detect leakage currents in the range of 150 to 300 mA but can be adapted to detect leakage currents in other ranges. The circuit 20 is able to distinguish from a properly operating circuit without adding a more expensive current feedback to the controller.

The control circuit 20 includes a large capacitor C, which, in the preferred embodiment, has a value within the range of approximately 1 to 4.7 uF. However, the invention also may be practiced with a capacitor having a value outside of the preceding range. The capacitor C is connected between the source terminal of the high side FET 12 and ground. The capacitor C also provides a secondary filtering function of reduced conducted emissions due to solenoid operation. While one capacitor C is shown in FIG. 2, it will be appreciated that the invention also may be practiced by placing a plurality of parallel capacitors between the source terminal of the high side FET 12 and ground. The voltage divider circuit $VD_F$ and the coil voltage divider circuits $VD_1$ through $VD_N$ complete the circuitry required for low level leakage current detection.

The circuit 20 also includes a controller 22 that typically includes a microprocessor (not shown) and an algorithm. The microprocessor is responsive to the algorithm to generate signals for controlling the circuit. In a manner similar to FIG. 1, the controller 22 is electrically connected to the gates of the high side FET 12 and the low side FETs $T_1$ through $T_N$ through an appropriate circuit (not shown) to adapt the controller output voltage level to the voltage level required to switch the FETs. The controller 22 also is electrically connected to the midpoints of the voltage divider circuit $VD_F$ and the coil voltage divider circuits $VD_1$ through $VD_N$. Again, while voltage dividers are shown in FIG. 2, it will be appreciated that other conventional methods and devices may be utilized to provide feedback to corresponding ports on the controller 22. Also, while a single controller 22 is shown in FIG. 2, it will be appreciated that the invention also may be practiced with a circuit containing multiple controllers (not shown). The controller 22 is operative to selectively switch the FETs 12 and $T_1$ through $T_N$ between their conducting and non-conducting states in response to a control algorithm while also monitoring feedback voltages appearing at the midpoints of the voltage divider circuits $VD_F$ and $VD_1$ through $VD_N$. The microprocessor and algorithm, as described below, are operative to detect low level leakage current through the coils $L_1$ through $L_N$.

The operation of the circuit shown in FIG. 2 will now be described. When the high side FET 12 is initially switched to its conducting state, the capacitor C will quickly charge with the charging current flowing from the source terminal of the high side FET 12, through the capacitor C, and directly to ground. Then, when the high side FET 12 and the low side FETs $T_1$ through $T_N$, are switched to their non-conducting states, the capacitor C will discharge through the feedback circuits. The initial leakage current from the capacitor C is limited by the combined parallel resistances of the voltage divider circuit $VD_F$ and the coil voltage divider circuits $VD_1$ through $VD_N$ to ground, and the relatively low leakage of the low side FETs $T_1$ through $T_N$, which is typically less than 100 uA. For a source voltage of 16V and typical voltage divider circuits, a typical initial current would be no more than 3.8 mA. The equivalent resistance at 16V, including FET leakage is roughly 4.2 kΩ. This will cause the voltage on the capacitor C to decay relatively slowly due to a relatively long time constant, such as approximately 20 ms for a 4.7 uF capacitor.

A relatively large leakage current of 150 mA, which is far greater than a typical leakage current, would typically not be enough current to cause movement of a solenoid valve armature. However, this amount of leakage current would cause the voltage to decay 40 times more quickly than normal. The difference in the voltage decay rate could be observed on all N+1 of the voltage feedbacks which include N low side solenoid FETs $T_1$ through $T_N$ and the one high side FET 12, within a few milliseconds. Since the detection can occur within one software loop, which is typically 7 ms, the check can be performed without impacting availability of solenoids in the event that they need to be activated during the next software loop.

Figure 3:
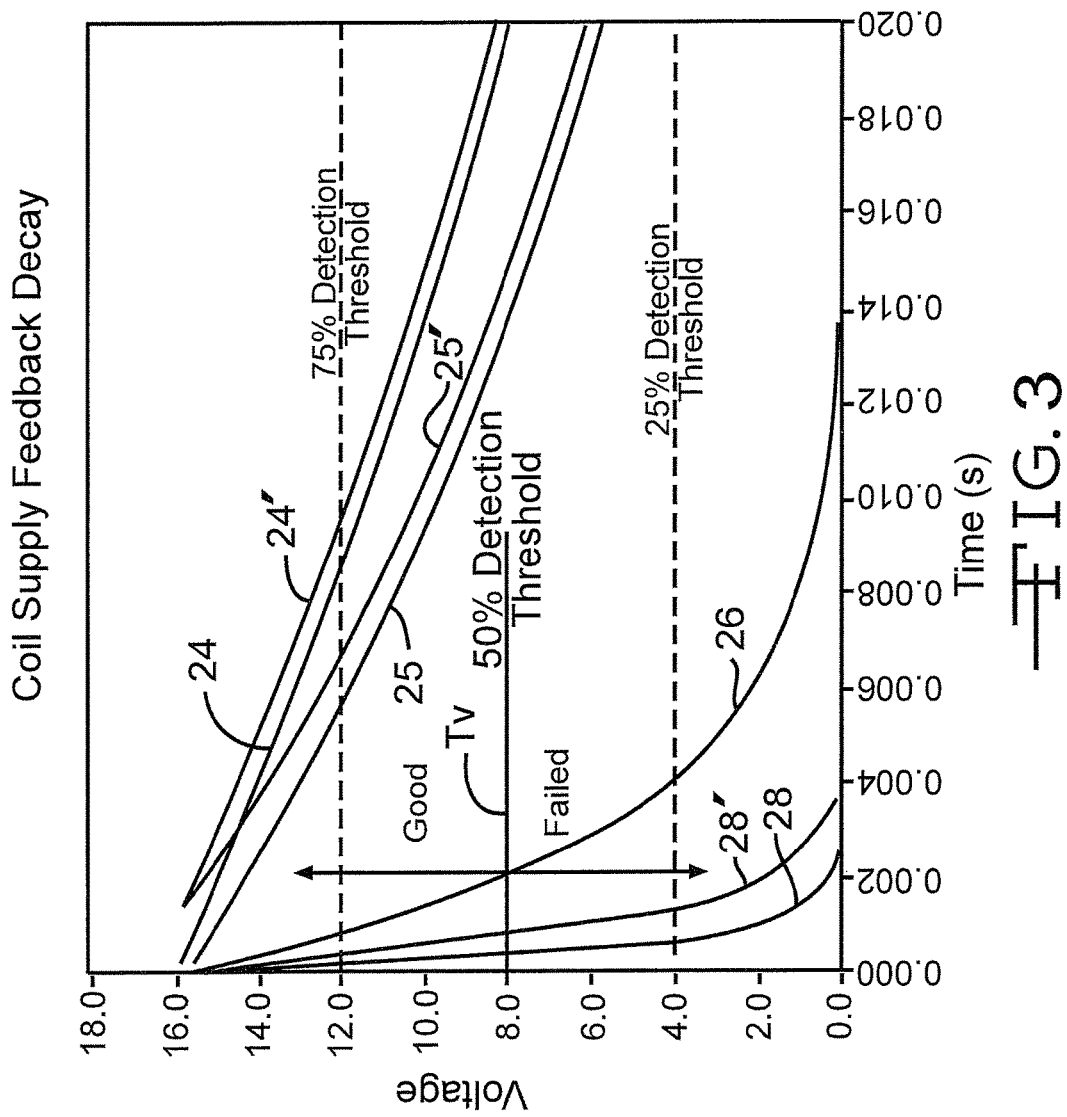
FIG. 3 is a graph illustrating the operation of the circuit shown in FIG. 2.

A series of curves shown in FIG. 3 illustrate the operation of the present invention. The curves assume a control system having 12 low side solenoid FETs and 1 high side FET with the voltage decay rate observed on all 13 of the voltage feedbacks circuits which include 12 coil voltage divider circuits $VD_N$ and one high side voltage divider circuit $VD_F$, within a few milliseconds. As stated above, because the detection can occur within one software loop, typically 7 ms, the check can be performed without impacting availability of solenoids in the event that they need to be activated during the next software loop. Among the curves shown in FIG. 3 are the following:

The curve labeled 26 represents an expected voltage decay (Voltage(det)) that assumes that the leakage current is 10 times the nominal leakage current and 6.8 times the minimum. Thus, the Voltage (det) curve 26 represents the desired detection threshold;

The curve labeled 28 represent an expected Voltage(fail) decay that assumes that the leakage current is much less than what could cause an undesirable response of unwanted movement by a solenoid armature, typically 150 mA; and The remaining voltage traces labeled 24', 25', and 28' show the impact of a maximum software delay of 1 ms between requesting a check of the feedback voltages and a disabling of the controller output upon the above unprimed voltage decay curves.

It can be seen from FIG. 3 that there is a large separation between the minimum proper operating decay voltage 25 and the failure decay voltage 28 due to large leakage, if the feedback voltages are read at 2 ms after the request to turn off the high side FET, and a voltage threshold $T_v$ of 50% of the initial voltage is used. This, in combination with the fact that there are N voltage feedbacks, allows for a robust detection, even with a 1 ms software delay. Thus, the present invention contemplates a method for detection of leakage current that includes monitoring the voltage feedback levels in the control circuit 20 after the elapse of a predetermined time T. If any of the monitored feedback voltages are less than a predetermined voltage threshold $T_v$, it is an indication of an excessive leakage current, and an error message is generated. The generation of the error message may then be used to disable the system being controlled and/or signal an operator by, for example, illumination of a warning lamp. The invention contemplates that the test is run periodically because it requires disabling the high side FET 12. However, the test requires only one iteration of the system controller. The invention contemplates that the test is run once a minute; however, the test also may be run more or less frequently. Furthermore, because the high side FET 12 must be disabled to run the test, the invention also contemplates that the test may only be run when activation of the solenoid coils is not required. Therefore, when a system operational mode, such as, for example, use of ABS, TC, ESC, etc., that requires activation of the solenoid valves, the test is inhibited from being performed.

Figure 4:
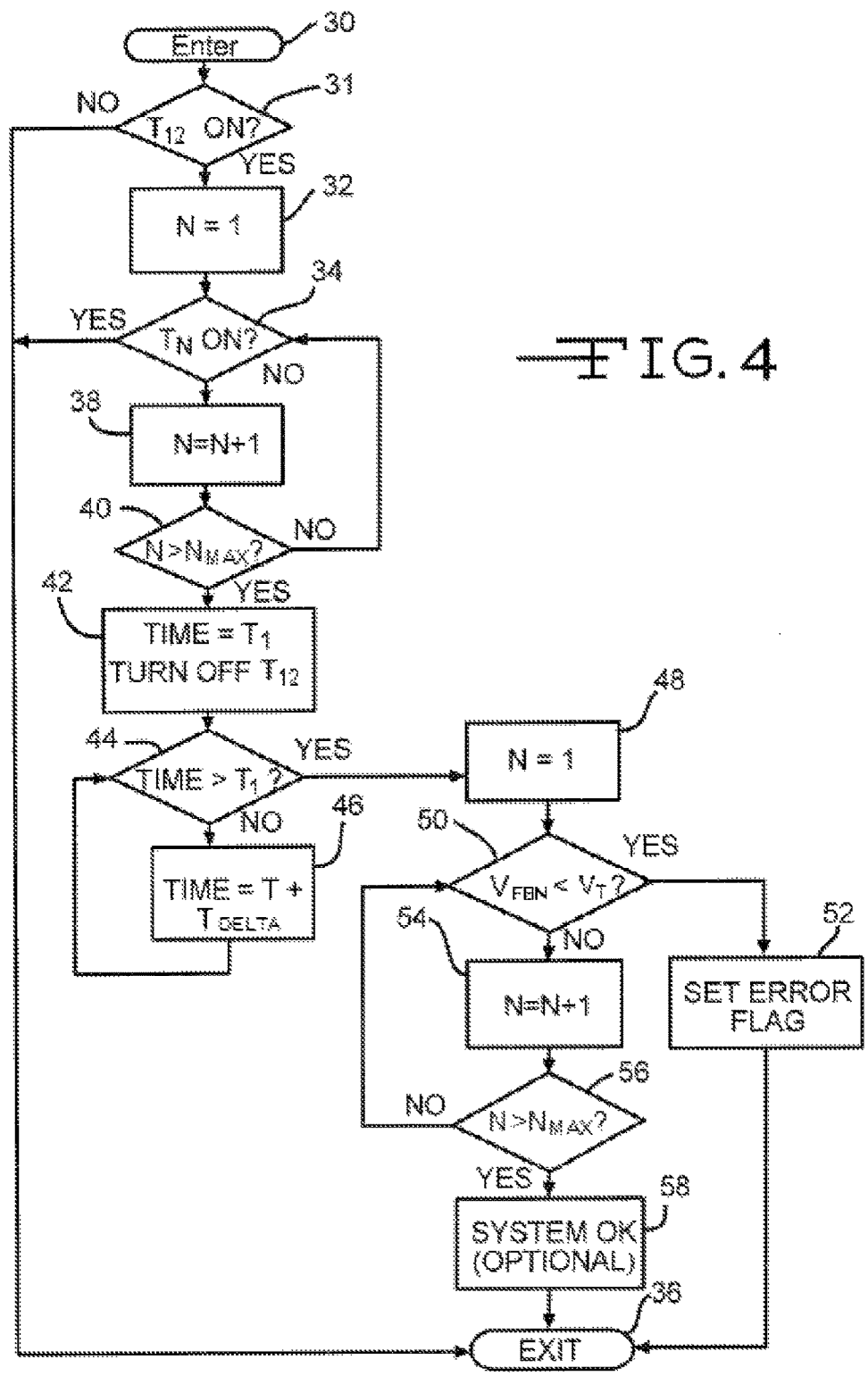
FIG. 4 is a flow chart for an algorithm for the operation of the circuit shown in FIG. 2.

The method of detection described above includes an algorithm that is illustrated by the flow chart shown in FIG. 4. The algorithm is entered through block 30 and proceeds to decision block 31, where the conducting state of the high side FET 12 is checked. The present invention requires that the high side FET is conducting in order to charge the capacitor C before starting the test. Therefore, if it is determined that the high side FET 12 is in a non-conducting state, the algorithm exits through block 36 and is reentered at a later time. If, in decision block 31, it is determined that the high side FET 12 is in a conducting state, the algorithm enters a first subroutine for checking the condition of the solenoid coils included in the circuit 20 by proceeding to functional block 32, where an index N is set to unity. The subroutine continues to decision block 34 where $FET_N$ is checked to determine whether it is on. Because detection of leakage current is only carried out when all of the FETs in the circuit 20 are in a non-conducting state, the test can not be run if $FET_N$ is in a conducting state and the subroutine exits the algorithm through block 36. If, in decision block 34, it is determined that $FET_N$ is in a non-conducting state, the subroutine transfers to functional block 38, where the index N is increased by one. The subroutine then advances to decision block 40. In decision block 40, the current value of the index N is compared to the total number of FETs in the circuit 20 $N_{MAX}$, where $N_{MAX}$ includes both the high side FET 12 and all of the low side FETs $T_1$ through $T_N$. Thus, for circuit 20, $N_{MAX}$ =N+1. If N is less than or equal to $N_{MAX}$, not all of the FET states have been checked and the subroutine transfers back to decision block 34. If, in decision block 40, N is greater than $N_{MAX}$, the status of all of the FETs have been checked, and it has been determined that all of the FETs are in their non-conducting states. Accordingly, the algorithm leaves the first subroutine by transferring to functional block 42. It will be appreciated that, for the example circuit shown in FIG. 2, the status of the high side FET 12 is checked when N=N+1.

Upon reaching functional block 42, the algorithm enters a second subroutine for timing the start of the test. In functional block 42, a timing index TIME is set equal to an initial time $T_1$, which may be selected as any value, including zero. Also, in functional block 42, the high side FET 12 is changed to a non-conducting state. This change may occur before, after, or when the initial time is set. The subroutine then advances to decision block 44, where the timing index TIME is compared to a timer threshold $T_t$. For the example described above in FIG. 3, the timer threshold $T_t$ would be set at two milliseconds; however, other values may be utilized for the timer threshold $T_t$. If the timing index TIME is less than or equal to the timer threshold $T_t$, it is not time to start the test portion of the algorithm, and the subroutine transfers to functional block 46 where the timing index is increased by an increment of time, $T_{DELTA}$. The subroutine then returns to decision block 44. If, in decision block 44, it is determined that the timing index is greater than the timer threshold $T_t$, it is time to start the test portion of the algorithm, and the subroutine transfers to functional block 48 to enter a third subroutine where the algorithm tests for leakage currents. It will be appreciated that by setting both the initial time $T_{t\,1}$ and the timer threshold $T_t$, as zero, the second subroutine will be bypassed by the algorithm.

Upon entering the third subroutine, the index N is again set to unity in functional block 48. The subroutine then advances to decision block 50, where the feedback voltage $V_{FBN}$ associated with the current value of the index N is compared to a voltage threshold $V_T$. In the example described above, the voltage threshold $V_T$ was selected as approximately half of the magnitude of the supply voltage V+; however, it will be appreciated that other values may be utilized for the voltage threshold $V_T$, such as, for example, 25 percent of the supply voltage V+ or 75 percent of the supply voltage V+. If the feedback voltage $V_{FBN}$, is less than the voltage threshold $V_T$, it is an indication of excessive leakage current through one of the FETs or due to another cause, such as, for example, a short circuit developing upon the circuit board substrate of the controller 22, and the subroutine transfers to functional block 52 where an error flag is set. The subroutine then exits through block 36.

If, in decision block 50, it is determined that the feedback voltage $V_{FBN}$, is greater than or equal to the voltage threshold $V_T$, it is an indication that any leakage current through the associated FET $T_N$ is at or below a satisfactory level and the subroutine transfers to functional block 54. In functional block 54, the subroutine increases the index N by one and then advances to decision block 56. In decision block 56 the current value of the index N is compared to the total number of FETs in the circuit 20, $N_{MAX}$. If N is less than or equal to $N_{MAX}$, not all of the FET leakage currents have been checked and the subroutine transfers back to decision block 50 for another iteration. If, in decision block 56, N is greater than $N_{MAX}$, the leakage currents of all of the FETs have been checked and it has been determined that all are at or below a satisfactory level. Accordingly, the algorithm leaves the third subroutine by transferring to functional block 58. In functional block 58, which is optional, the circuit 20 is deemed to be operational and a corresponding flag is set. The algorithm then exits through block 36. It will be appreciated that, for the example circuit shown in FIG. 2, the feedback voltage for the voltage divider circuit $VD_F$ is checked when N=N+1.

It will be understood that the algorithm illustrated in FIG. 4 is intended to be exemplary and that the invention also may be practiced with algorithms that differ from that shown in the figure. For example, the algorithm could also include an additional subroutine to require that the excessive leakage current or currents exist for a predetermined number of iterations before the error flag is set (not shown). Alternately, all N+1 feedback voltages could be checked and the total number of failures counted (not shown). The threshold for failure would then be based upon the number of failures counted, with the number of failures indicating a failure may be either a fixed number or a variable number. For example, it could be decided that a failure has occurred and the error flag set upon finding that half or more of the coils had failed. However, less than half could also be used as the criteria. By checking all of the feedback voltages before setting the error flag, the system is protected from electrical transients or noise than may cause a false setting of the error flag. Alternately, the controller 22 could sample the high side feedback voltage 10 consecutive times and, if 9 of the 10 samples are below the threshold, an error flag would be set, while if less than 9 of the 10 samples were below the threshold, the error flag would not be set (not shown). Similarly, less than 9 of the 10 samples being below the threshold may be utilized to trigger setting the error flag.

While the preferred embodiment has been described and illustrated for FETs, it will be appreciated that the invention also may be practiced with other electronic switching devices, such as, for example, bipolar transistors. Additionally, while brake control systems typically place the solenoid coils within an Electronic Control Unit (ECU), the present invention contemplates that the capacitor C may located either within or outside of the ECU. Furthermore, it is contemplated that the invention may be utilized to detect leakage currents through any coil that is switched on and off by an electronic switch and is not limited to solenoid coils, as described above. Finally, it is contemplated that the test may be implemented to read multiple samples of each feedback voltage with the samples spaced apart by a predetermined time period (not shown). The voltage difference between the samples would then be used to determine a time rate of change of the voltage. The voltage rate of change would then be compared to a rate of change threshold as the criteria for setting an error flag.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A control circuit comprising:
   a first electronic switch having a first terminal adapted to be connected to a voltage supply and a second terminal;
   a coil having a first end connected to the second terminal of the first electronic switch and a second end;
   a second electronic switch having a first terminal connected to the second end of the coil and a second terminal adapted to be connected to ground;
   a capacitor having a first terminal connected to the first end of the coil and a second terminal adapted to be connected to ground such that the capacitor is charged when the first electronic switch is in a conducting state and is discharged when the first electronic switch is in a non-conducting state; and
   a feedback circuit connected to one of the first and second ends of the coil so as to monitor a rate of decay of the capacitor charge and to determine that a fault is present in either the coil, the first electronic switch, or the second electronic switch when an excessive leakage current is detected.

2. The control circuit defined in claim 1 wherein the feedback circuit compares a sensed voltage at the one end of the coil to a voltage threshold at a predetermined time.

3. The control circuit defined in claim 1 wherein the feedback circuit is connected to the first end of the coil.

4. The control circuit defined in claim 1 wherein the feedback circuit is connected to the second end of the coil.

5. The control circuit defined in claim 2 wherein the feedback circuit generates a warning signal upon determining that the sensed voltage is less than the voltage threshold.

6. The control circuit defined in claim 2 wherein the feedback circuit periodically compares the sensed voltage to the voltage threshold and determines that a fault is present when the sensed voltage is less than the voltage threshold for a predetermined number of consecutive periods.

7. A method comprising the steps of:
   (a) providing a control circuit including (1) a first electronic switch having a first terminal adapted to be connected to a voltage supply and a second terminal; (2) a coil having a first end connected to the second terminal of the first electronic switch and a second end; (3) a second electronic switch having a first terminal connected to the second end of the coil and a second terminal adapted to be connected to ground; and (4) a capacitor having a first terminal connected to the first end of the coil and a second terminal adapted to be connected to ground such that the capacitor is charged when the first electronic switch is in a conducting state and is discharged when the first electronic switch is in a non-conducting state;

(b) placing the first electronic switch in a conducting state to charge the capacitor;

(c) placing each of the first and second electronic switches in a non-conducting state; and (d) monitoring a rate of decay of charge of the capacitor and determining that a fault is present in either the coil, the first electronic switch, or the second electronic switch when an excessive leakage current is detected.

8. The method defined in claim 7 wherein step (d) is performed by comparing a sensed voltage at the one end of the coil to a voltage threshold at a predetermined time.

9. The control circuit defined in claim 8 wherein step (d) is performed by periodically comparing the sensed voltage to the voltage threshold and determining that a fault when the sensed voltage is less than the voltage threshold for a predetermined number of consecutive periods.

10. The method defined in claim 7 wherein step (a) is performed by providing a plurality of coils each having a first end connected to the second terminal of the first electronic switch and a second end; a plurality of second electronic switches each having a first terminal connected to a respective one of the second ends of the plurality of coils and a second terminal adapted to be connected to ground; and a capacitor having a first terminal connected to each of the first ends of the coil and a second terminal adapted to be connected to ground such that the capacitor is charged when the first electronic switch is in a conducting state and is discharged when the first electronic switch is in a non-conducting state; and wherein step (d) is performed by providing a plurality of feedback circuits each connected to a respective one of the first and second ends of each of the plurality of coils.

11. A control circuit comprising:
a first electronic switch having a first terminal adapted to be connected to a voltage supply and a second terminal;
a coil having a first end connected to the second terminal of the first electronic switch and a second end;
a second electronic switch having a first terminal connected to the second end of the coil and a second terminal adapted to be connected to ground;
a capacitor having a first terminal connected to the first end of the coil and a second terminal adapted to be connected to ground such that the capacitor is charged when the first electronic switch is in a conducting state and is discharged when the first electronic switch is in a non-conducting state; and
a feedback circuit connected to one of the first and second ends of the coil so as to monitor a rate of decay of the capacitor charge to determine if there is a fault present in either the coil, the first electronic switch, or the second electronic switch,
wherein the feedback circuit compares a sensed voltage at the one end of the coil to a voltage threshold at a predetermined time to determine if there is a fault present in either the coil, the first electronic switch, or the second electronic switch, and
wherein either (1) the feedback circuit generates a warning signal upon determining that the sensed voltage is less than the voltage threshold, or (2) the feedback circuit periodically compares the sensed voltage to the voltage threshold and determines that a fault is present when the sensed voltage is less than the voltage threshold for a predetermined number of consecutive periods.

12. The control circuit defined in claim 11 wherein the feedback circuit generates a warning signal upon determining that the sensed voltage is less than the voltage threshold.

13. The control circuit defined in claim 11 wherein the feedback circuit periodically compares the sensed voltage to the voltage threshold and determines that a fault is present when the sensed voltage is less than the voltage threshold for a predetermined number of consecutive periods.

14. A method comprising the steps of:
(a) providing a control circuit including (1) a first electronic switch having a first terminal adapted to be connected to a voltage supply and a second terminal; (2) a coil having a first end connected to the second terminal of the first electronic switch and a second end; (3) a second electronic switch having a first terminal connected to the second end of the coil and a second terminal adapted to be connected to ground; and (4) a capacitor having a first terminal connected to the first end of the coil and a second terminal adapted to be connected to ground such that the capacitor is charged when the first electronic switch is in a conducting state and is discharged when the first electronic switch is in a non-conducting state;

(b) placing the first electronic switch in a conducting state to charge the capacitor;

(c) placing each of the first and second electronic switches in a non-conducting state; and (d) monitoring a rate of decay of charge of the capacitor to determine if a fault is present in either the coil, the first electronic switch, or the second electronic switch, wherein step (d) is performed by periodically comparing a sensed voltage at the one end of the coil to a voltage threshold at a predetermined time and determining that a fault present in either the coil, the first electronic switch, or the second electronic switch when the sensed voltage is less than the voltage threshold for a predetermined number of consecutive periods.

\* \* \* \* \*